US007821509B2

(12) United States Patent
 Choi (10) Patent No.: US 7,821,509 B2
(45) Date of Patent: Oct. 26, 2010

(54) SHIFT REGISTER AND ORGANIC LIGHT EMITTING DISPLAY DEVICE USING THE SAME

(75) Inventor: Sang Moo Choi, Suwon (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1084 days.

(21) Appl. No.: 11/518,281

(22) Filed: Sep. 7, 2006

(65) Prior Publication Data
 US 2007/0091695 A1 Apr. 26, 2007

(30) Foreign Application Priority Data
 Oct. 25, 2005 (KR) ............... 10-2005-0100879

(51) Int. Cl.
 *G09G 5/00* (2006.01)
(52) U.S. Cl. ............ 345/204; 345/98; 345/100; 377/64; 377/70; 377/73; 377/77; 377/81; 327/333
(58) Field of Classification Search ............ 345/98, 345/204, 100; 377/64, 70, 73, 77, 81; 327/333
 See application file for complete search history.

(56) References Cited

U.S. PATENT DOCUMENTS 5,990,857 A * 11/1999 Kubota et al. ............ 345/98

2004/0212556 A1 * 10/2004 Senda et al. ............ 345/55

FOREIGN PATENT DOCUMENTS

| JP | 2827867 | 9/1998 |
| JP | 2005-129211 | 5/2005 |
| KR | 2001-0083157 | 8/2001 |

OTHER PUBLICATIONS

Patent Abstract of Japan for Japanese Application No. 05-331705, filed Dec. 27, 1993 in the name of Kentaro Kitamura.
Patent Abstract of Japan for Japanese Publication No. 2005-129211, published May 19, 2005 in the name of Jian-Shen Yu.
Korean Patent Abstracts for Korean Publication No. 1020010083157 A, published Aug. 31, 2001 in the name of Yasushi Kubota, et al.

* cited by examiner

*Primary Examiner*—Richard Hjerpe
*Assistant Examiner*—Priyank Shah
(74) *Attorney, Agent, or Firm*—Christie, Parker & Hale, LLP (57) ABSTRACT

A shift register capable of reducing power consumption is provided. The shift register includes: a clock signal supply line for supplying a clock signal; a plurality of selectors coupled to the clock signal supply line to generate driving signals in response to sampling signals; and a plurality of stages respectively coupled to the selectors to generate the sampling signals in response to the driving signals, wherein at least one of the selectors is adapted to generate at least one of the driving signals in response to a previous one of the sampling signals supplied from a previous one of the stages and a next one of the sampling signals supplied from a next one of the stages.

20 Claims, 9 Drawing Sheets

SHIFT REGISTER AND ORGANIC LIGHT EMITTING DISPLAY DEVICE USING THE SAME

CROSS-REFERENCE TO RELATED APPLICATION

This application claims priority to and the benefit of Korean Patent Application No. 10-2005-0100879, filed on Oct. 25, 2005, in the Korean Intellectual Property Office, the entire content of which is incorporated herein by reference.

BACKGROUND

1. Field of the Invention

The present invention relates to a shift register and an organic light emitting display device using the same, and more particularly, to a shift register capable of reducing power consumption and an organic light emitting display device using the same.

2. Discussion of Related Art

An organic light emitting display device is a flat panel display (FPD) that displays an image using organic light emitting diodes (OLEDs) that generate light by re-combination of electrons and holes. The organic light emitting display device has a high response speed and is driven with low power consumption. In a conventional organic light emitting display device, currents corresponding to data signals are supplied to OLEDs using driving transistors formed in pixels, respectively, so that light is generated by the OLEDs.

The above-described conventional organic light emitting display device includes a data driver for supplying data signals to data lines, a scan driver for supplying (or sequentially supplying) scan signals to scan lines, and a display region including a plurality of pixels connected to the data lines and the scan lines.

The pixels included in the display region are selected when the scan signals are supplied to the scan lines to receive the data signals from the data lines. The pixels that received the data signals generate light components of a certain (or predetermined) brightness corresponding to the data signals to display a certain (or predetermined) image. In the conventional organic light emitting display device, the scan driver includes a plurality of stages in order to generate (or sequentially generate) the scan signals.

Figure 1:
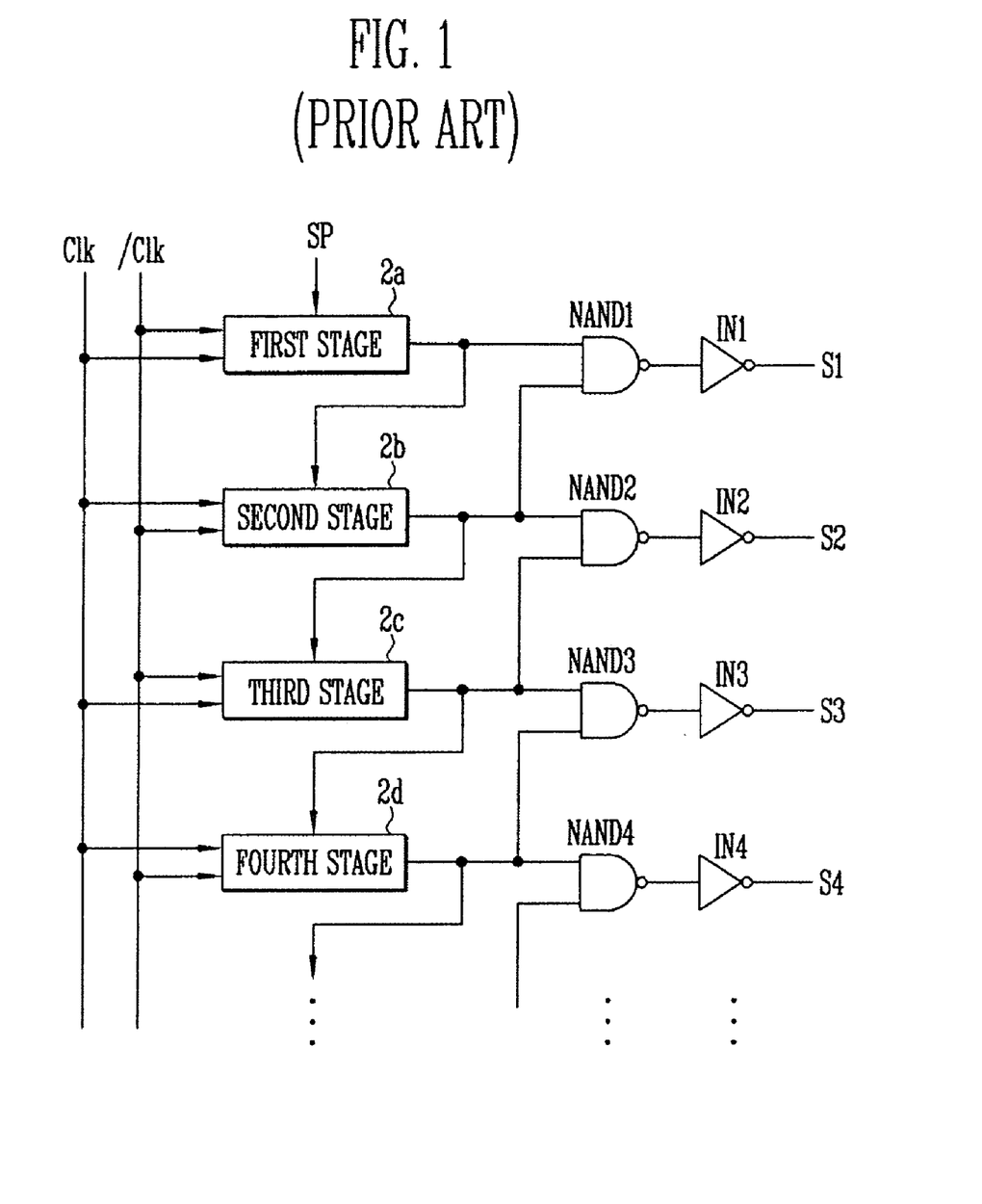
FIG. 1 illustrates a shift register of a conventional scan driver.

FIG. 1 schematically illustrates a shift register of a conventional scan driver.

Referring to FIG. 1, the shift register of the conventional scan driver includes stages 2a, 2b, 2c, 2d, . . . for supplying (or sequentially supplying) scan signals to a plurality of scan lines S1, S2, S3, S4, . . . ; NAND gates NAND1, NAND2, NAND3, NAND4, . . . serially connected between the output ports of the stages 2a, 2b, 2c, 2d, and the scan lines S1, S2, S3, S4, . . . ; and inverters IN1, IN2, IN3, IN4, . . . .

Each of the stages 2a, 2b, 2c, 2d, . . . receives a clock signal Clk and a clock bar signal (or an inverse clock signal) /Clk supplied from an external source. Each of the stages 2a, 2b, 2c, 2d, . . . that received the clock signal Clk and the clock bar signal /Clk generates a sampling pulse when a sampling pulse or a start pulse SP is supplied from a previous stage to supply the generated sampling pulse to each of the NAND gates NAND1, NAND2, NAND3, NAND4, . . . . The NAND gates NAND1, NAND2, NAND3, NAND4, . . . perform a NAND operation using the output signals of a current stage and a next stage to supply the NAND operation results to the inverters IN1, IN2, IN3, IN4, . . . . Then, the inverters IN1, IN2, IN3, IN4, . . . invert the outputs of the NAND gates NAND1, NAND2, NAND3, NAND4, . . . to supply the inverted outputs to the scan lines S1, S2, S3, S4, . . . .

Figure 2:
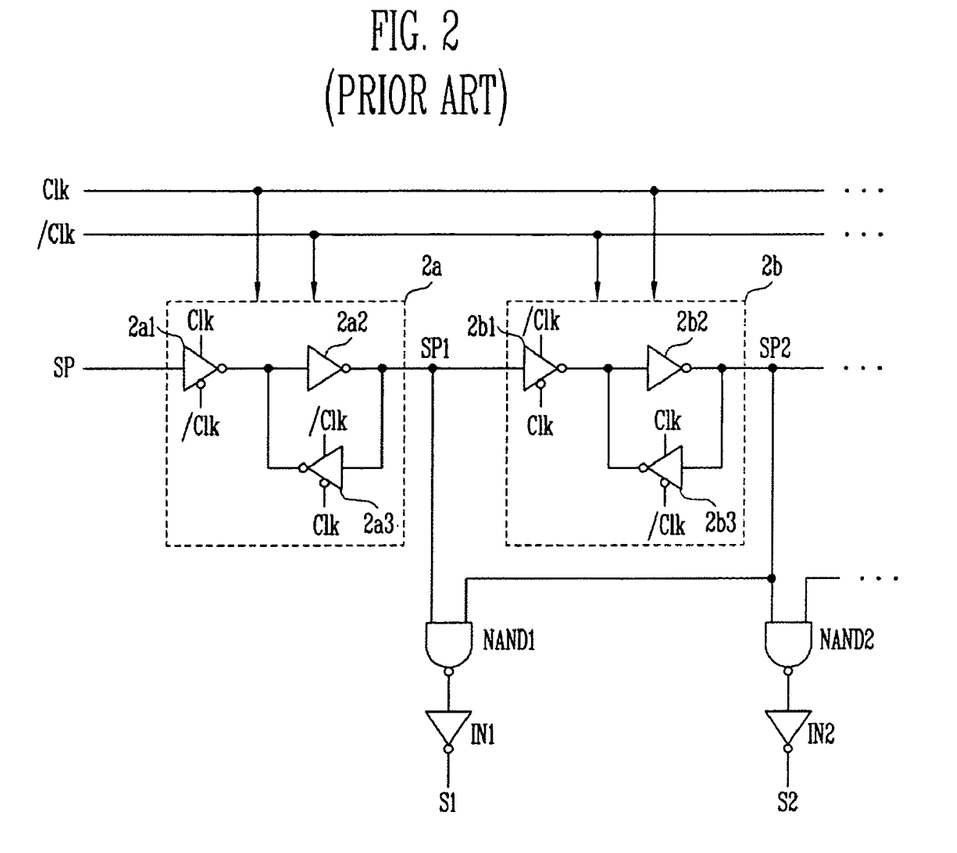
FIG. 2 is a circuit diagram illustrating the stages illustrated in FIG. 1.

FIG. 2 is a circuit diagram illustrating the stages illustrated in FIG. 1 in more detail. In FIG. 2, for convenience purposes, the first and second stages 2a and 2b are illustrated.

Referring to FIG. 2, each of the first and second stages 2a and 2b includes a first inverter 2a1 or 2b1 for receiving a start pulse SP or a sampling pulse, a second inverter 2a2 or 2b2 for inverting the output of the first inverter 2a1 or 2b1, and a third inverter 2a3 or 2b3 for feeding back the output of the second inverter 2a2 or 2b2 to the input of the second inverter 2a2 or 2b2.

The first inverter 2a1 or 2b1 is synchronized with the clock signals Clk and /Clk when the start pulse SP or the sampling pulse is supplied in order to output a logic (or predetermined logic) signal.

The second inverter 2a2 or 2b2 inverts the logic signal supplied from the first inverter 2a1 or 2b1 to generate a sampling pulse SP1 or SP2. Here, the first sampling pulse SP1 generated by the second inverter 2a2 included in the first stage 2a is supplied to the first NAND gate NAND1 and the second stage 2b. The second sampling pulse SP2 generated by the second inverter 2a2 included in the second stage 2b is supplied to the second NAND gate NAND2 and the third stage 2c.

The third inverter 2a3 or 2b3 inverts the sampling pulse SP1 or SP2 of the second inverter 2a2 or 2b2 to supply the inverted sampling pulse SP1 or SP2 to the input terminal of the second inverter 2a2 or 2b2. That is, the third inverter 2a3 or 2b3 assists in stably generating the sampling pulse SP1 or SP2 of the second inverter 2a2 or 2b2.

The first NAND gate NAND1 performs a NAND operation using the sampling pulses SP1 and SP2 output from the first and second stages 2a and 2b to supply the NAND operation result to the inverter IN1. Then, the inverter IN1 inverts the output of the first NAND gate NAND1 to supply the inverted output to the scan line S1.

Figure 3:
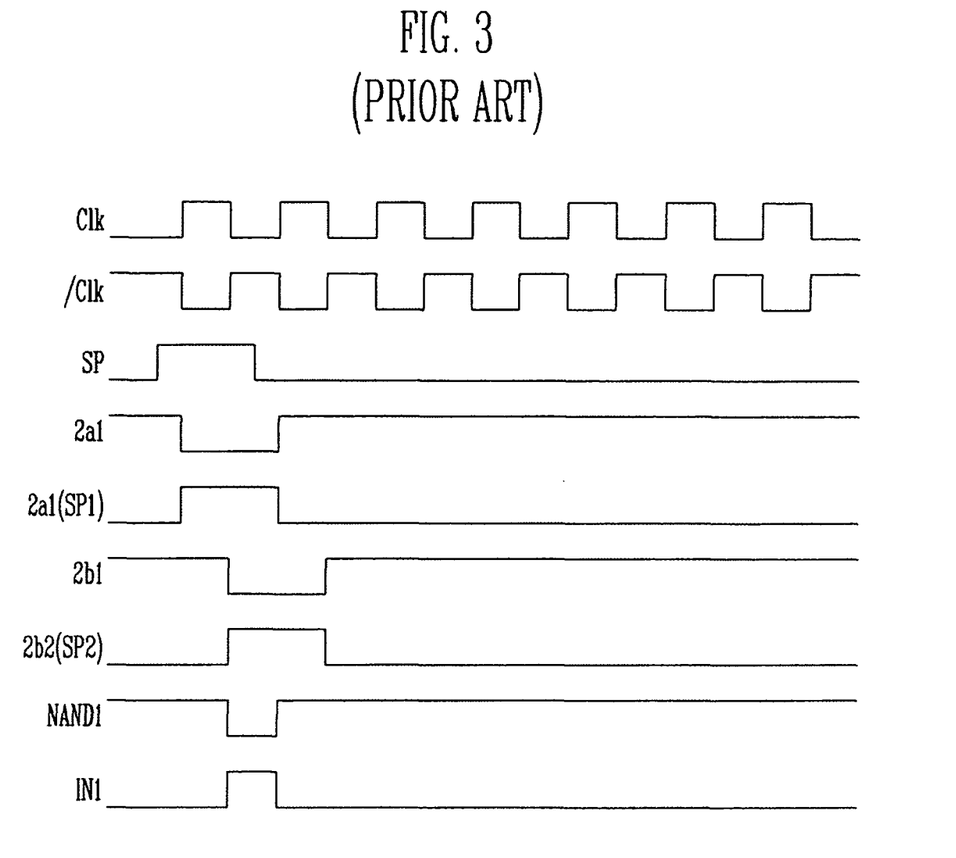
FIG. 3 illustrates waveforms for driving the stages illustrated in FIG. 2.

The operations of the conventional stages 2a and 2b will be described in more detail with reference to the waveforms of FIG. 3.

First, the clock signal Clk and the clock bar signal /Clk are supplied from the external source to the stages 2a, 2b, . . . , respectively. The start pulse SP is supplied from an external source to the first stage 2a. Then, the first inverter 2a generates an output signal at a low level when the clock signal Clk at a high level and the clock bar signal /Clk at a low level are input. Here, the output signal at the low level is transited to a high level when the supply of the start pulse SP is stopped and the clock signal Clk at the high level and the clock bar signal /Clk at the low level are input. The output of the first inverter 2a1 is inverted by the second inverter 2a2. That is, the second inverter 2a2 inverts the output of the first inverter 2a1 to generate the first sampling pulse SP1. The first sampling pulse SP1 generated by the second inverter 2a2 is supplied to the second stage 2b and the first NAND gate NAND1.

The first inverter 2b1 of the second stage 2b that received the first sampling pulse SP1 generates an output signal at a low level when the clock signal Clk at the low level and the clock bar signal /Clk at the high level are input. Here, the output signal at the low level is transited to a high level when the supply of the first sampling pulse SP1 is stopped and the clock signal Clk at the low level and the clock bar signal /Clk at the high level are input. The output of the first inverter 2b1 is inverted by the second inverter 2b2. That is, the second inverter 2b2 inverts the output of the first inverter 2b1 to generate the second sampling pulse SP2. The second sampling pulse SP2 generated by the second inverter 2b2 is supplied to the third stage 2c and the second NAND gate NAND2.

On the other hand, the first NAND gate NAND1 outputs a low level signal only when the first and second sampling pulses SP1 and SP2 are simultaneously supplied and outputs a high level signal in other cases. The inverter IN1 inverts the output of the first NAND gate NAND1 to generate a scan signal and supplies the generated scan signal to the scan line S1. Alternatively, in accordance with the structure of a pixel of an alternative embodiment the output of the first NAND gate NAND1 may be directly supplied to the scan line S1.

In a conventional art, the above-described processes are repeated to sequentially supply the scan signals to the scan lines S1, S2, . . . . However, the conventional scan driver consumes a large amount of power due to high capacitance generated during the input of the clock signal Clk and the clock bar signal /Clk. That is, in the conventional art, the clock signal Clk and the clock bar signal /Clk are supplied to the stages 2a, 2b, . . . , respectively. Here, a capacitance (or a predetermined capacitance) is generated in the part where the signal lines overlap with each other when the clock signal Clk and the clock bar signal /Clk are supplied and increases power consumption.

Also, in the conventional art, the clock signal Clk and the clock bar signal /Clk are directly input to the first inverters 2a1, 2b1, . . . and the third inverters 2a3, 2b3, . . . included in the stages 2a, 2b, . . . , respectively. The clock signal Clk and the clock bar signal /Clk are directly input to the gate terminals of the transistors that constitute the first inverters 2a1, 2b1, . . . and the third inverters 2a3, 2b3, . . . . Here, the gate terminals of the transistors have high capacitance. Therefore, when the clock signal Clk and the clock bar signal /Clk are directly input to the gate terminals of the transistors that constitute the first inverters 2a1, 2b1, . . . and the third inverters 2a3, 2b3, . . . , power consumption increases due to the high capacitance. In particular, since the clock signal Clk and the clock bar signal /Clk are supplied to all of the stages 2a, 2b, . . . , regardless of the driving of the stages 2a, 2b, . . . , the capacitance generated by the first inverters 2a1, 2b1, . . . and the third inverters 2a3, 2b3, . . . increases to thereby increase power consumption.

On the other hand, in the conventional art, in order to reduce the capacitance applied to the clock signal Clk and the clock bar signal /Clk, switches are added before the stages 2a, 2b, . . . , respectively, and the added switches are turned on during driving. However, in the above-described method, since the stages 2a, 2b, are floated when the switches are turned off, driving is not stably performed.

SUMMARY OF THE INVENTION

Accordingly, it is an aspect of the present invention to provide a shift register capable of reducing power consumption and an organic light emitting display device using the same.

According to a first embodiment of the present invention, there is provided a shift register. The shift register includes: a clock signal supply line for supplying a clock signal; a plurality of selectors coupled to the clock signal supply line to generate driving signals in response to sampling signals; and a plurality of stages respectively coupled to the selectors to generate the sampling signals in response to the driving signals, wherein at least one of the selectors is adapted to generate at least one of the driving signals in response to a previous one of the sampling signals supplied from a previous one of the stages and a next one of the sampling signals supplied from a next one of the stages.

In one embodiment, a first one of the selectors generates a first one of the driving signals in response to a start signal supplied from an external source and a next one of the sampling signals supplied from a next one of the stages.

In one embodiment, each of the selectors includes: a first NOR gate for outputting a low level signal in a case when at least one of a previous one of the sampling signals from a previous one of the stages and a next one of the sampling signals from a next one of the stages are supplied to the first NOR gate and for outputting a high level signal in other cases; a switch coupled to the clock signal supply line and adapted to turn on in response to the low level signal output from the first NOR gate; a second NOR gate for receiving a clock signal supplied from the switch and at least one of the low level signal or the high level signal supplied from the first NOR gate to generate a second one of the driving signals as an output; and a first inverter for inverting the second one of the driving signals to generate a first one of the driving signals.

In one embodiment, the selectors are arranged into a first group of the selectors and a second group of the selectors, wherein the second group of the selectors are respectively arranged to alternate with the first group of the selectors, and wherein each of the second group of the selectors further includes a second inverter positioned between the switch and the second NOR gate.

According to a second embodiment of the present invention, there is provided an organic light emitting display device. The second embodiment includes a data driver for supplying data signals to data lines; and a plurality of pixels selected when the scan signals are supplied to receive the data signals and to display an image corresponding to the data signals, wherein the scan driver includes: a clock signal supply line for supplying a clock signal; a plurality of selectors coupled to the clock signal supply line to generate driving signals in response to sampling signals; and a plurality of stages respectively coupled to the selectors to generate the sampling signals in response to the driving signals, wherein at least one of the selectors is adapted to generate a corresponding one of the driving signals in response to an adjacent one of the sampling signals supplied from an adjacent one of the stages.

In one embodiment, a jth one of the selectors coupled to a jth one of the stages generates a jth one of the driving signals in response to a (j−1)th one of the sampling signals supplied from a (j−1)th one of the stages and a (j+1) one of the sampling signals supplied from a (j+1)th one of the stages, and wherein j is a natural number.

In one embodiment, wherein the selectors include a plurality of switches coupled to the clock signal supply line, and at least one of the switches is turned on only in a period when an adjacent one of the sampling signals is supplied from an adjacent one of the stages.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

Figure 4:
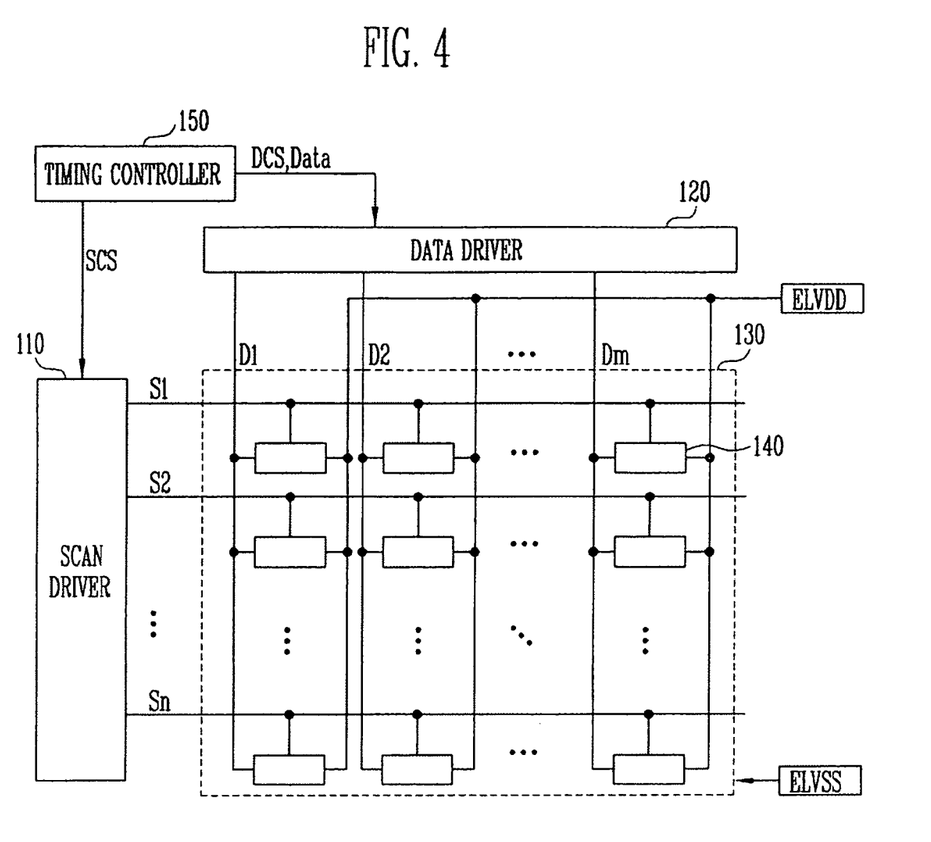
FIG. 4 illustrates an organic light emitting display device according to an embodiment of the present invention.

FIG. 4 illustrates an organic light emitting display device according to an embodiment of the present invention.

Referring to FIG. 4, the organic light emitting display device according to the embodiment of the present invention includes a display region 130 including a plurality of pixels 140 connected to (or coupled to) scan lines S1 to Sn and data lines D1 to Dm, a scan driver 110 for driving the scan lines S1 to Sn, a data driver 120 for driving the data lines D1 to Dm, and a timing controller 150 for controlling the scan driver 110 and the data driver 120.

The display region 130 includes the pixels 140 formed in the regions defined by the scan lines S1 to Sn and the data lines D1 to Dm. The pixels 140 receive a first power of a first power source ELVDD and a second power of a second power source ELVSS. The pixels 140 then supply currents corresponding to data signals from the first power source ELVDD via organic light emitting diodes (OLED) to the second power source ELVSS.

The timing controller 150 generates data driving control signals DCS and scan driving control signals SCS in response to synchronizing signals supplied from an external source. The data driving control signals DCS generated by the timing controller 150 are supplied to the data driver 120, and the scan driving control signals SCS generated by the timing controller 150 are supplied to the scan driver 110. The timing controller 150 supplies data Data supplied from an external source to the data driver 120.

The scan driver 110 receives the scan driving control signals SCS. The scan driver 110 then supplies (or sequentially supplies) scan signals to the scan lines S1 to Sn for every horizontal period.

The data driver 120 receives the data driving control signals DCS from the timing controller 150. The data driver 120 that received the data driving control signals DCS supplies the data signals to the data lines D1 to Dm whenever the scan signals are supplied.

Figure 5:
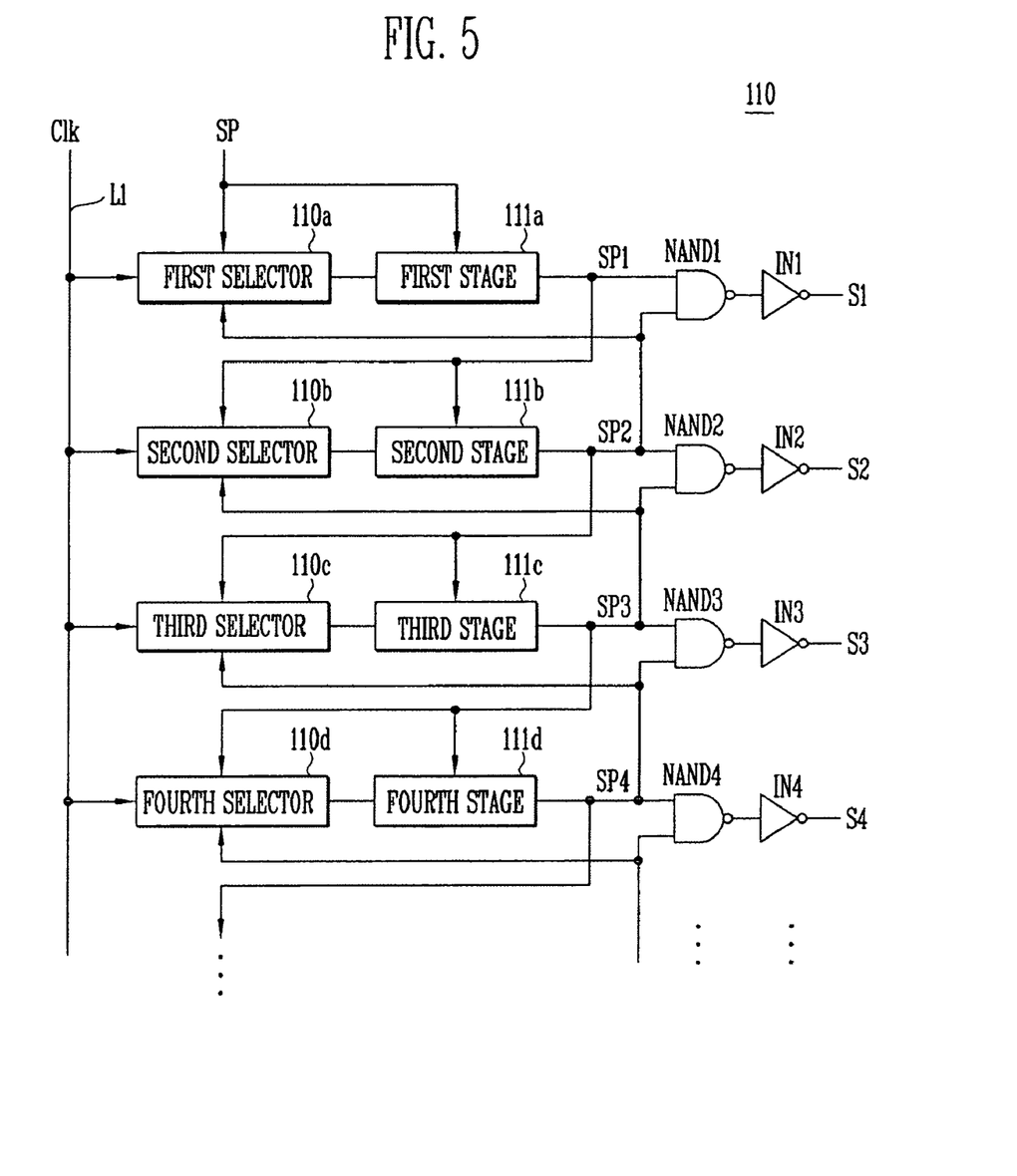
FIG. 5 illustrates a shift register of a scan driver of FIG. 4.

FIG. 5 illustrates a shift register of the scan driver 110 according to an embodiment of the present invention.

Referring to FIG. 5, the shift register of the scan driver 110 according to the embodiment of the present invention includes a plurality of stages 111a, 111b, 111c, 111d, . . . ; a plurality of selectors 110a, 110b, 110c, 110d, . . . provided between the stages 111a, 111b, 111c, 111d, . . . and a clock signal supply line L1; and a plurality of NAND gates NAND1, NAND3, NAND3, NAND4, . . . and a plurality of inverters IN1, IN2, IN3, IN4, . . . serially connected between the stages 111a, 111b, 111c, 111d, . . . and the scan lines S1, S2, S3, S4, . . . .

The selectors 110a, 110b, 110c, 110d, . . . receive a clock signal Clk from the clock signal supply line L1. Each of the selectors 110a, 110b, 110c, 110d, . . . receives sampling pulses or signals (or a start pulse or signal SP) from a previous stage and a next stage. That is, a jth (j is a natural number) selector 110j receives sampling pulses (or signals) SPj−1 and SPj+1 from a (j−1)th stage 111j−1 and a (j+1)th stage 111j+1. Then, the jth selector 110j generates driving signals (or predetermined driving signals) in periods where the sampling pulses (or signals) SPj−1 and SPj+1 are supplied to supply the generated driving signals to a jth stage 111j connected to (or coupled to) the jth selector 110j. That is, according to the present invention, the selectors 110a, 110b, 110c, 110d, . . . control the stages 111a, 111b, 111c,111d, . . . to sequentially generate the sampling pulses SP1, SP2, SP3, SP4, . . . while sequentially generating driving signals in response to sampling pulses.

Each of the stages 111a, 111b, 111c,111d, . . . is driven when each of the driving signals is supplied from each of the selectors 110a, 110b, 110c, 110d. connected to (or coupled to) the stages 111a, 111b, 111c,111d, . . . ; and, at the same time, a sampling pulse is supplied from a previous stage. In this case, the sampling pulse SPj generated by the jth stage 111j is supplied to a (j−1)th selector 110j−1, a (j+1)th selector 110j+1, and a (j+1)th stage 111j+1. The sampling pulse SPj generated by the jth stage 111j is supplied to a jth NAND gate NANDj connected to (or coupled to) the jth stage 111j.

Each of the NAND gates NAND1, NAND2, NAND3, NAND4, . . . performs a NAND operation on the sampling pulses of a current stage and a next stage to supply the NAND operation result to each of the inverters IN1, IN2, IN3, IN4, . . . . That is, the jth NAND gate NANDj performs a NAND operation on the jth sampling pulse SPj supplied from the jth stage and the (j+1)th sampling pulse SPj+1 supplied from the (j+1)th stage to supply the NAND operation result to the inverter INj.

The inverters IN1, IN2, IN3, IN4, . . . invert the outputs of the NAND gates connected to (or coupled to) the inverters IN1, IN2, IN3, IN4, . . . to supply the inverted outputs to the scan lines S1, S2, S3, S4, . . . . Alternatively, the inverters IN1, IN2, IN3, IN4, . . . may be removed in accordance with the conductivity type of the transistors (e.g., PMOS transistors or NMOS transistors) included in the pixels 140. For example, when the transistors included in the pixels 140 are PMOS transistors, the inverters IN1, IN2, IN3, IN4, . . . are removed so that the outputs of the NAND gates NAND1, NAND2, NAND3, NAND4, . . . are directly supplied to the scan lines S1, S2, S3, S4, . . . .

Figure 6:
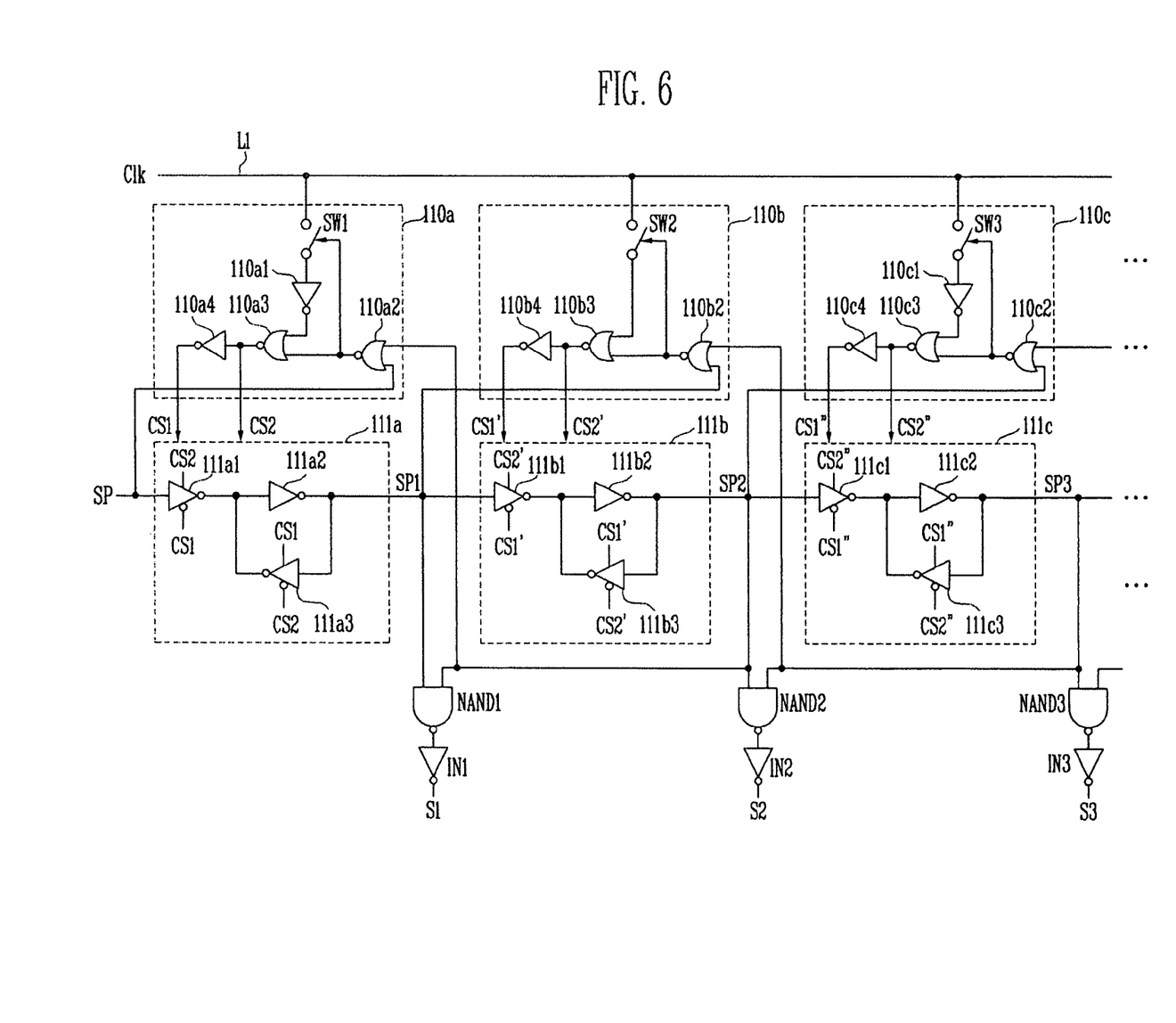
FIG. 6 is a circuit diagram illustrating stages and selectors of FIG. 5.

FIG. 6 is a circuit diagram illustrating the structures of the selectors 110a, 110b,110c, . . . and the stages 111a, 111b, 111c of FIG. 5 in more detail. In FIG. 6, for convenience purposes, the structures of the first, second, and third stages 111a to 111c are illustrated and the following description will be mainly directed to the first stage 111a and the first selector 110a.

Referring to FIG. 6, the first stage 111a according to the present invention includes a first inverter 111a1 that receives the start pulse (or signal) SP, a second inverter 111a2 for inverting the output of the first inverter 111a1, and a third inverter 111a3 for feeding back the output of the second inverter 111a2 to the input of the second inverter 111a2.

Figure 7:
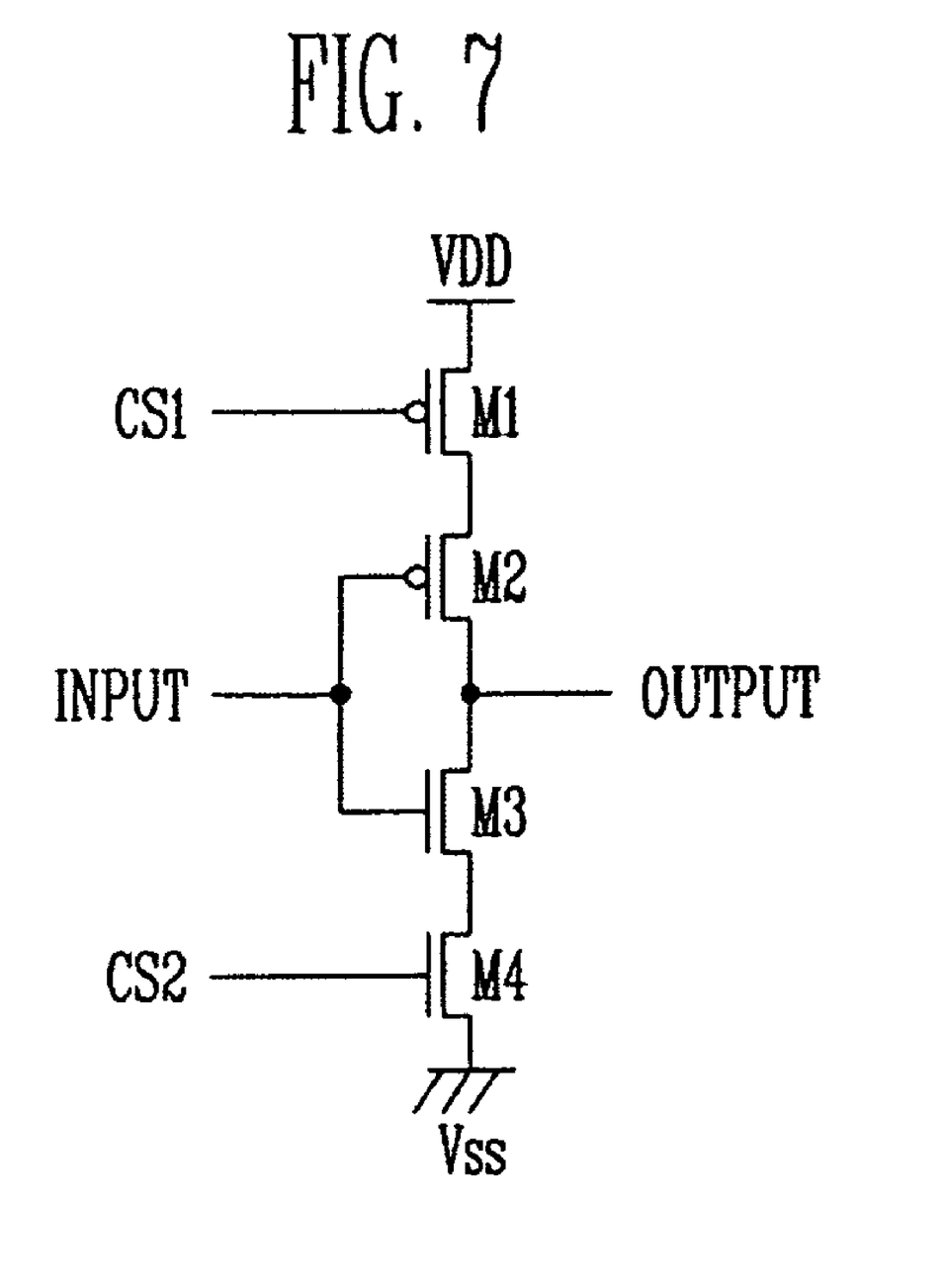
FIG. 7 is a circuit diagram illustrating a structure of a first inverter of FIG. 6.

The first inverter 111a1 outputs a logic (or predetermined logic) signal when the driving signals CS1 and CS2 are supplied from the first selector 110a and, at the same time, the start pulse SP is supplied. The first inverter 111a1 inverts the start pulse SP to output a logic signal when the first driving signal CS1 is at a low level and the second driving signal CS2 is at a high level. Therefore, the first inverter 111a1 includes four transistors M1, M2, M3 and M4 as illustrated in FIG. 7. The first transistor M1 is controlled by the first driving signal CS1. The fourth transistor M4 is controlled by the second driving signal CS2. The second and third transistors M2 and M3 are controlled by an input signal (that is, the start pulse SP).

The second inverter 111a2 inverts a logic (or predetermined logic) signal supplied from the first inverter 111a1 to generate the first sampling pulse (or signal) SP1. The second inverter 111a2 supplies the first sampling pulse SP1 to the first NAND gate NAND1, the second selector 110b, and the second stage 111b.

The third inverter 111a3 inverts the first sampling pulse SP1 to supply the inverted first sampling pulse SP1 to the input terminal of the second inverter 111a2. That is, the third inverter 111a3 assists in stably generating the sampling pulse SP1 of the second inverter 111a2.

The structures of the remaining stages 111b, 111c, ... are substantially the same as the structure of the first stage 111a. However, each of the remaining stages 111b, 111c, ... is driven when a sampling pulse is supplied from a previous stage. That is, the second stage 111b is driven when the first sampling pulse SP1 is supplied from the first stage 111a, and the third stage 111c is driven when the second sampling pulse SP2 is supplied from the second stage 111b.

The first selector 110a includes a first NOR gate 110a2 that receives the start pulse SP and the second sampling pulse SP2, a switch SW1 connected to (or coupled to) the clock signal supply line L1 controlled by the output of the first NOR gate 110a2, a fourth inverter 110a1 connected to (or coupled to) the switch SW1, a second NOR gate 110a3 controlled by the outputs of the fourth inverter 110a1 and the first NOR gate 110a2, and a fifth inverter 110a4 for inverting the output of the second NOR gate 110a3.

The first NOR gate 110a2 receives the start pulse SP and the second sampling pulse SP2. As described above, the first NOR gate 110a2 outputs a low level signal when at least one of the start pulse SP and the second sampling pulse SP2 is input and outputs a high level signal in other cases.

The switch SW1 is turned on when the low level signal is input from the first NOR gate 110a2 and is turned off in other cases. When the switch SW1 is turned on, the clock signal Clk is supplied to the fourth inverter 110a1.

The fourth inverter 110a1 inverts the clock signal Clk to supply the inverted clock signal Clk to the second NOR gate 110a3.

The second NOR gate 110a3 outputs a low level signal when at least one of the outputs of the fourth inverter 110a1 and the first NOR gate 110a2 is at a high level and outputs a high level signal in other cases. The signal output from the second NOR gate 110a3 is supplied to the first inverter 111a1 and the third inverter 111a3. Here, the output signal of the second NOR gate 110a3 is used as the second driving signal CS2.

The fifth inverter 110a4 inverts the second driving signal CS2 to generate the first driving signal CS1. The first driving signal CS1 generated by the fifth inverter 110a4 is supplied to the first inverter 111a1 and the third inverter 111a3.

The structures of the odd selectors 110c, 110e, ... that follow with the first selector 110a are substantially the same as the structure of the first selector 110a. That is, the structures of the odd selectors 110a, 110c, ... are substantially the same as the structure of the first selector 110a. The structures of the even selectors 110b, 110d, ... are also substantially the same as the structure of the first selector 110a with the exception that each of these structures can substantially be obtained by removing the fourth inverter 110a1 from the first selector 110a. That is, the second selector 110b includes a first NOR gate 110b2, a second NOR gate 110b3, and a fifth inverter 110b4, but does not include a fourth inverter (e.g., the fourth inverter of the first selector 110a).

Figure 8:
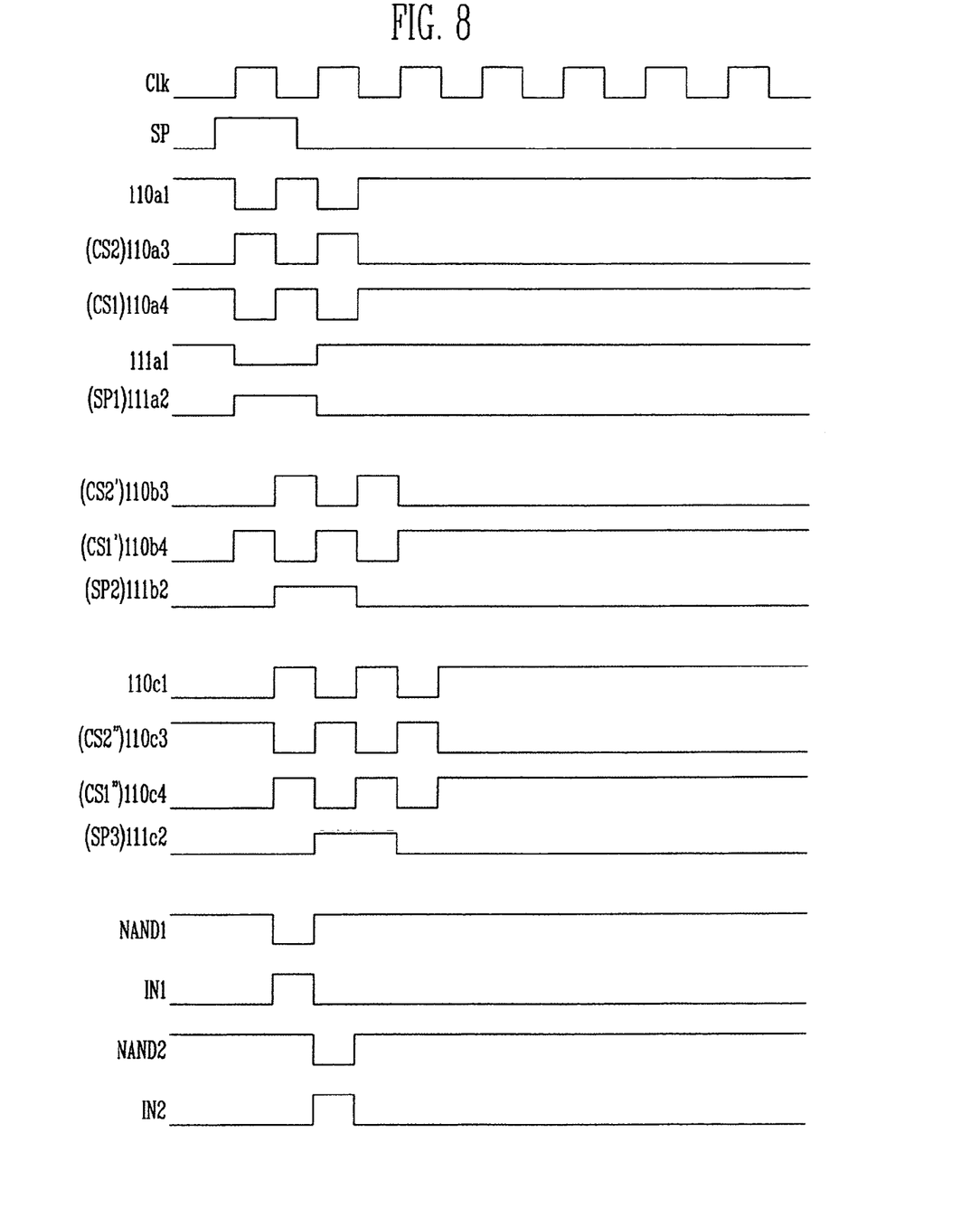
FIG. 8 illustrates waveforms for driving the stages and the selectors illustrated in FIG. 6.

FIG. 8 illustrates waveforms for driving and/or operating the selectors and the stages of FIG. 6.

Referring to FIG. 8, the clock signal Clk is supplied from the clock signal supply line L1 to all of the selectors 110a, 110b, 110c, 110d.... Then, the start pulse SP is supplied to the first selector 110a and the first stage 111a.

When the start pulse SP is supplied, a low level signal is output from the first NOR gate 110a2 included in the first selector 110a. Then, the switch SW1 connected to (or coupled to) the first NOR gate 110a2 is turned on. When the first switch SW1 is turned on, the clock signal Clk is input to the fourth inverter 110a1. At this time, the fourth inverter 110a1 inverts the clock signal Clk to output the inverted clock signal Clk.

Then, the second NOR gate 110a3 performs a NOR operation on the output signals of the fourth inverter 110a1 and the first NOR gate 110a2 to generate the second driving signal CS2. Here, the second NOR gate 110a3 supplies the second driving signal CS2 to the first stage 111a and the fifth inverter 110a4. Then, the fifth inverter 110a4 inverts the second driving signal CS2 to generate the first driving signal CS1 and outputs the generated first driving signal CS1 to the first stage 111a.

The first NOR gate 110a2 outputs a low level signal when the start pulse SP and the second sampling pulse SP2 are supplied. Therefore, as illustrated in FIG. 8, the first and second driving signals CS1 and CS2 are output in periods when the start pulse SP and also when the second sampling pulse SP2 are input. The first NOR gate 110a2 outputs a high level signal in periods when the start pulse SP and the second sampling pulse SP2 are not input (that is, in periods where a low level signal is input to two input terminals). Then, the switch SW1 is turned off and the outputs of the second NOR gate 110a3 and the fifth inverter 110a4 maintain a specific state.

On the other hand, the first inverter 111a1 included in the first stage 111a inverts the start pulse SP when the first driving signal CS1 is transited to a low level and the second driving signal CS2 is transited to a high level to output the inverted start pulse SP. Then, the second inverter 111a2 inverts the output of the first inverter 111a1 to output the first sampling pulse SP1. Here, the first sampling pulse SP1 is generated in one period of the clock signal Clk. That is, since the first driving signal CS1 is transited to the low level and the second driving signal CS2 is transited to the high level after one period of the clock signal Clk and after the first sampling pulse SP1 has been generated, the first sampling pulse SP1 is generated for one period of the clock signal Clk. On the other hand, the third inverter 111a3 feeds back the first sampling pulse SP1 to the input terminal of the second inverter 111a2 to assist in the stable generation of the first sampling pulse SP1.

The first sampling pulse SP1 generated by the first stage 111a is supplied to the second selector 110b and the second stage 111b.

The first sampling pulse SP1 is input to the first NOR gate 110b2 included in the second selector 110b. Then, the first NOR gate 110b2 outputs a low level signal to turn on a switch SW2. When the switch SW2 is turned on, the clock signal Clk is input to the second NOR gate 110b3. At this time, as illustrated in FIG. 8, the second NOR gate 110b3 performs a NOR operation on the clock signal Clk and the output of the first NOR gate 102b2 to output a second driving signal CS2'. The fifth inverter 110b4 inverts the second driving signal CS2' to generate a first driving signal CS1'.

The first NOR gate 110b2 outputs a low level signal when the first sampling pulse SP1 and a third sampling pulse SP3 are supplied. Therefore, as illustrated in FIG. 8, the first and second driving signals CS1' and CS2' are output in periods when the first sampling pulse SP1 and also when the third sampling pulse SP3 are input.

The first inverter 111b1 included in the second stage 111b inverts the first sampling pulse SP1 when the first driving signal CS1' is transited to a low level and the second driving signal CS2' is transited to a high level to output the inverted first sampling pulse SP1. The second inverter 111 b2 inverts the output of the first inverter 111b1 to generate the second sampling pulse SP2. At this time, the third inverter 111b3 inverts the second sampling pulse SP2 to feed back the inverted second sampling pulse SP2 to the input terminal of the second inverter 111 b2 to assist in the stable generation of the second sampling pulse SP2 that is generated.

The second sampling pulse SP2 generated by the second stage 111b is supplied to the third selector 110c and the third stage 111c.

The second sampling pulse SP2 is input to the first NOR gate 110c2 included in the third selector 110c. Then, the first NOR gate 110c2 outputs a low level signal to turn on the switch SW3. When the switch SW3 is turned on, the clock signal Clk is input to the fourth inverter 111c1. Then, the fourth inverter 111c1 inverts the clock signal Clk to supply the inverted clock signal Clk to the second NOR gate 110c3. At this time, the second NOR gate 110c3 performs a NOR operation on the outputs of the fourth inverter 111c1 and the first NOR gate 110c2 to output a second driving signal CS2". The fifth inverter 110c4 inverts the second driving signal CS2" to generate the first driving signal CS1".

The first NOR gate 110c2 outputs a low level signal when the second sampling pulse SP2 and a fourth sampling pulse SP4 are supplied. Therefore, as illustrated in FIG. 8, the first and second driving signals CS1" and CS2" are output in periods when the second and fourth sampling pulses SP2 and SP4 are input.

The first inverter 111c1 included in the third stage 111c inverts the second sampling pulse SP2 when the first driving signal CS1" is transited to a low level and the second driving signal CS2" is transited to a high level to output the inverted second sampling pulse SP2. The second inverter 111 b2 inverts the output of the first inverter 111b1 to generate the third sampling pulse SP3.

On the other hand, the first NAND gate NAND1 performs a NAND operation on the first sampling pulse SP1 and the second sampling pulse SP2 to output the NAND operation result. Therefore, the first NAND gate NAND1 outputs a low level signal in periods where the first and second sampling pulses SP1 and SP2 are overlapping each other and outputs a high level signal in other periods. The first inverter IN1 inverts the output of the first NAND gate NAND1 to supply the inverted output to the scan line S1 as a scan signal. Alternatively, the first inverter IN1 may be removed and the output of the first NAND gate NAND1 may be directly supplied to the scan line S1 as a scan signal.

According to the embodiment of the present invention, the above-described processes are repeated to supply (or sequentially supply) the scan signals to the scan lines S1 to Sn.

Here, according to the embodiment of the present invention, one clock signal Clk is supplied to the selectors 110a, 110b, . . . . Therefore, unlike the conventional art where two clock signals are supplied, the embodiment of the present invention can reduce or prevent capacitance from being generated due to the overlapping of clock signal supply lines and to thereby reduce power consumption.

According to the above, each of the switches SW1, SW2, . . . included in the selectors is turned on only when sampling pulses are supplied from upper and lower stages adjacent thereto and is turned off in the other cases. Therefore, the capacitance generated when the clock signals Clk are supplied is minimized to further reduce power consumption. Also, according to the present invention, since the stages are not floated when the switches SW1, SW2, . . . included in the selectors are turned off, the embodiment of the present invention can more stably perform its driving processes.

Figure 9:
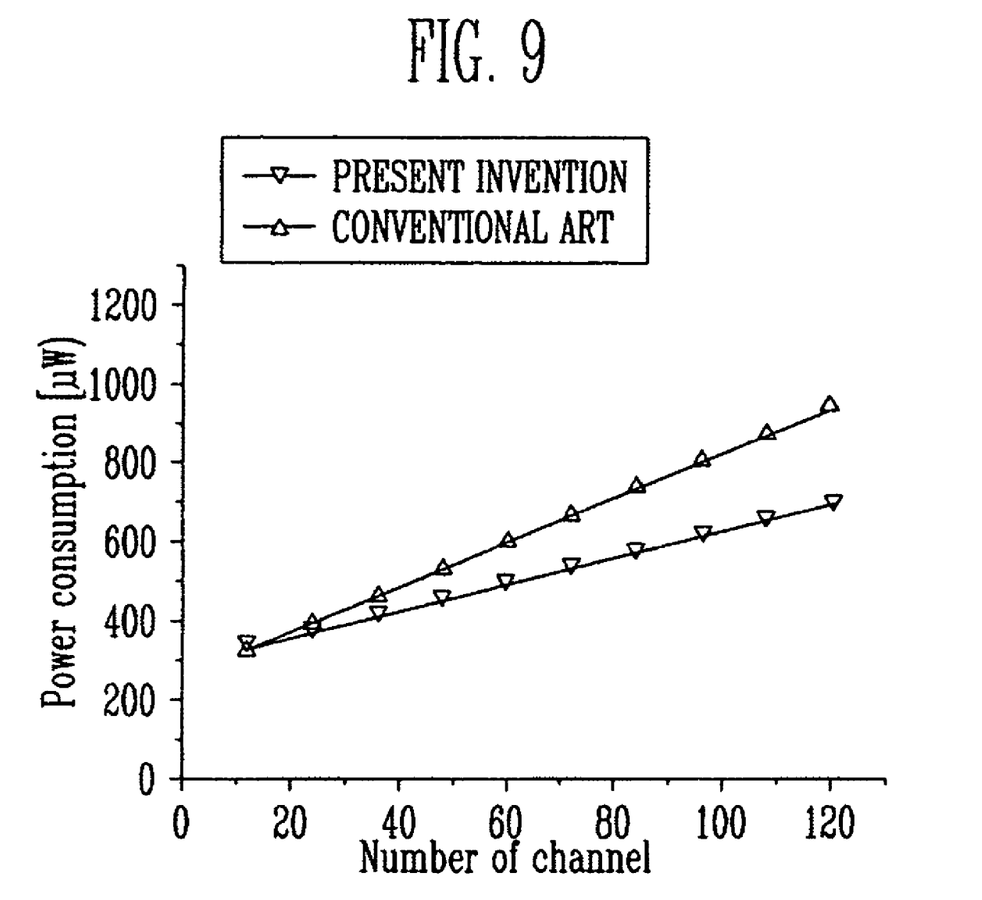
FIG. 9 is a graph illustrating power consumption of a scan driver according to an embodiment of the present invention.

FIG. 9 is a graph illustrating power consumption of a scan driver according to an embodiment of the present invention. In FIG. 9, the lateral axis illustrates channels of scan drivers and the longitudinal axis illustrates the power consumption of the scan drivers.

Referring to FIG. 9, it is noted that the scan driver according to the embodiment of the present invention consumes a smaller amount of power than the amount of power the conventional scan driver consumes. In addition, the difference in how much less the power consumption of the embodiment of the present invention is as compared with the conventional scan driver becomes larger as the number of channels of the scan driver increases. As an example, the conventional scan driver of 120 channels consumes power of about 930 μW; the scan driver of 120 channels in one embodiment in accordance with the present invention consumes power of about 700 μW.

As described above, in a shift register according to an embodiment of the present invention and an organic light emitting display device using the same, since only one clock signal is supplied to the scan driver, it is possible to reduce or prevent capacitance from being generated due to the overlapping of the clock signal supply lines and to thus reduce power consumption. Also, according to one embodiment of the present invention, since selectors are respectively positioned before stages, and the switches included in the selectors are turned on only in partial periods of one frame, it is possible to further minimize the capacitance generated during the supply of the clock signal. Also, according to the present invention, since the stages are not floated when the switches included in the selectors are turned off, it is possible to stably perform a driving process.

Although certain embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A shift register comprising:
   a clock signal supply line for supplying a clock signal;
   a plurality of selectors coupled to the clock signal supply line to generate driving signals in response to sampling signals, each of the selectors comprising a first NOR gate; and
   a plurality of stages respectively coupled to the selectors to generate the sampling signals in response to the driving signals,
   wherein at least one of the selectors is adapted to generate at least one of the driving signals in response to a previous one of the sampling signals supplied from a previous one of the stages and a next one of the sampling signals supplied from a next one of the stages, and the first NOR gate is configured to generate a low level signal when at least one of a previous one of the sampling signals from a previous one of the stages and a next one of the sampling signals from a next one of the stages are supplied to the first NOR gate and to output a high level signal in other cases.

2. The shift register as claimed in claim 1, wherein a first one of the selectors generates a first one of the driving signals in response to a start signal supplied from an external source and a next one of the sampling signals supplied from a next one of the stages.

3. The shift register as claimed in claim 1, wherein each of the selectors further comprises:
a switch coupled to the clock signal supply line and adapted to turn on in response to the low level signal output from the first NOR gate;
a second NOR gate for receiving a clock signal supplied from the switch and at least one of the low level signal or the high level signal supplied from the first NOR gate to generate a second one of the driving signals as an output; and
a first inverter for inverting the second one of the driving signals to generate a first one of the driving signals.

4. The shift register as claimed in claim 3, wherein the selectors are arranged into a first group of the selectors and a second group of the selectors, wherein the second group of the selectors are respectively arranged to alternate with the first group of the selectors, and wherein each of the second group of the selectors further comprises:
a second inverter positioned between the switch and the second NOR gate.

5. The shift register as claimed in claim 4, wherein each of the selectors maintains a state of the output of the second NOR gate when the switch is turned off.

6. The shift register as claimed in claim 4, wherein each of the stages comprises:
a third inverter for inverting a previous one of the sampling signals from a previous one of the stages or a start signal from an external source supplied thereto in response to the first one of the driving signals and the second one of the driving signals to output the previous one of the sampling signals or the start signal as an inverted sampling signal or an inverted start signal;
a fourth inverter for inverting an output of the third inverter to generate an current one of the sampling signals; and
a fifth inverter for feeding back the output of the fourth inverter to an input of the fourth inverter.

7. The shift register as claimed in claim 6, wherein the third inverter is driven when the first one of the driving signals is at a low level and the second one of the driving signals is at a high level.

8. The shift register as claimed in claim 6, further comprising a plurality of NAND gates respectively coupled to the stages, wherein each of the NAND gates is coupled to receive the sampling signals from a current one of the stages and a next one of the stages and to generate a scan signal.

9. The shift register as claimed in claim 8, further comprising a plurality of inverters respectively coupled to output ports of the respective NAND gates.

10. The shift register as claimed in claim 1, wherein the clock signal supplied through the clock signal supply line is from an external source, and wherein only one clock signal needs to be supplied from the external source to reduce a parasitic capacitance.

11. An organic light emitting display device comprising:
a scan driver for supplying scan signals to scan lines;
a data driver for supplying data signals to data lines; and
a plurality of pixels selected when She scan signals are supplied to receive the data signals and to display an image corresponding to the data signals,
wherein the scan driver comprises:
a clock signal supply line for supplying a clock signal;
a plurality of selectors coupled to the clock signal supply line to generate driving signals in response to sampling signals, each of the selectors comprising a first NOR gate; and
a plurality of stages respectively coupled to the selectors to generate the sampling signals in response to the driving signals,
wherein at least one of the selectors is adapted to generate a corresponding one of the driving signals in response to an adjacent one of the sampling signals supplied from an adjacent one of the stages, and
the first NOR gate is configured to generate a low level signal when at least one of a previous one of the sampling signals from a previous one of the stages and a next one of the sampling signals from a next one of the stages are supplied to the first NOR gate and to output a high level signal in other cases.

12. The organic light emitting display device as claimed in claim 11, wherein a jth one of the selectors coupled to a jth one of the stages generates a jth one of the driving signals in response to a (j−1)th one of the sampling signals supplied from a (j−1)th one of the stages and a (j+1) one of the sampling signals supplied from a (j+1)th one of the stages, and wherein j is a natural number.

13. The organic light emitting display device as claimed in claim 12,
wherein the selectors comprise a plurality of switches coupled to the clock signal supply line, and
wherein at least one of the switches is turned on only in a period when an adjacent one of the sampling signals is supplied from an adjacent one of the stages.

14. The organic light emitting display device as claimed in claim 11, wherein a first selector among the selectors generates the driving signal when a start signal is supplied from the outside and the sampling signal is supplied from a next stage.

15. The organic light emitting display device as claimed in claim 11, wherein each of the selectors comprises:
a switch coupled to the clock signal supply line and adapted to turn in response to the low level signal output from the first NOR gate;
a second NOR gate for receiving a clock signal supplied from the switch and at least one of the low level signal or the high level signal supplied from the first NOR gate to generate a second one of the driving signals as an output; and
a first inverter for inverting the second one of the driving signals to generate a first one of the driving signals.

16. The organic light emitting display device as claimed in claim 15, wherein the selectors are arranged into a first group of the selectors and a second group of the selectors, wherein the second group of the selectors are respectively arranged to alternate with the first group of the selectors, and wherein each of the second group of the selectors further comprises:
a second inverter positioned between the switch and the second NOR gate.

17. The organic light emitting display device as claimed in claim 15, wherein each of the stages comprises:
a second inverter for inverting a previous one of the sampling signals from a previous one of the stages or a start signal from an external source supplied thereto in response to the first one of the driving signals and the second one of the driving signals to output the previous one of the sampling signals or the start signal as an inverted sampling signal or an inverted start signal;

a third inverter for inverting an output of the second inverter to generate an current one of the sampling signals; and a fourth inverter for feeding back the output of the third inverter to an input of the third inverter.

18. The organic light emitting display device as claimed in claim 17, wherein the third inverter is driven when the first one of the driving signals is at a low level and the second one of the driving signals is at a high level.

19. The organic light emitting display device as claimed in claim 17, further comprising a plurality of NAND gates respectively coupled to the stages, wherein each of the NAND gates is coupled to receive the sampling signals from a current one of the stages and a next one of the stages and to generate a scan signal.

20. The organic light emitting display device as claimed in claim 19, further comprising a plurality of inverters respectively coupled to output ports of the respective NAND gates.

* * * * *

UNITED STATES PATENT AND TRADEMARK OFFICE
CERTIFICATE OF CORRECTION

| | |
|---|---|
| PATENT NO. | : 7,821,509 B2 |
| APPLICATION NO. | : 11/518281 |
| DATED | : October 26, 2010 |
| INVENTOR(S) | : Sang Moo Choi |

It is certified that error appears in the above-identified patent and that said Letters Patent is hereby corrected as shown below:

FIG. 9, Sheet 9 of 9      Delete Drawing Sheet 9 and substitute therefore the Drawing Sheet, consisting of FIG. 9, as shown on the attached page.

Delete "channel"
Insert -- channels --

Column 11, Claim 6, line 45      Delete "an"
Insert -- a --

Column 12, Claim 11, line 1      Delete "She"
Insert -- the --

Signed and Sealed this
Twenty-seventh Day of December, 2011

David J. Kappos
*Director of the United States Patent and Trademark Office*

FIG. 9